(12) United States Patent
Meznarich (10) Patent No.: US 10,284,137 B2
(45) Date of Patent: May 7, 2019

(54) BRACKETS FOR INSTALLING BUILDING ATTACHMENTS

(71) Applicant: Russ Edward Meznarich, Paso Robles, CA (US)

(72) Inventor: Russ Edward Meznarich, Paso Robles, CA (US)

(*) Notice: Subject to any disclaimer, the term of this patent is extended or adjusted under 35 U.S.C. 154(b) by 0 days.

(21) Appl. No.: 15/818,330

(22) Filed: Nov. 20, 2017

(65) Prior Publication Data

US 2018/0073240 A1 Mar. 15, 2018

Related U.S. Application Data

(62) Division of application No. 15/184,783, filed on Jun. 16, 2016, now Pat. No. 9,822,524.

(Continued)

(51) Int. Cl.
*H02S 20/23* (2014.01)
*F16M 13/02* (2006.01)
(Continued)

(52) U.S. Cl.
CPC ............ *H02S 20/23* (2014.12); *E04B 1/2604* (2013.01); *E04D 13/00* (2013.01); *E04D 13/12* (2013.01);
(Continued)

(58) Field of Classification Search
CPC ....... H02S 20/23; E04D 13/00; E04B 1/2604; E04B 2001/2644; E04B 2001/405; F16M 13/02
See application file for complete search history.

(56) References Cited

U.S. PATENT DOCUMENTS 1,241,827 A 10/1917 Davis
3,184,800 A * 5/1965 Nelson ............. E04B 1/2608
403/217

(Continued)

FOREIGN PATENT DOCUMENTS

JP 10212762 8/1998
KR 1670346 B1 * 1/2016

OTHER PUBLICATIONS

"Heavy Duty Fascia Bracket Gal", http://store.demak.com.au/heavy-duty-fascia-bracket-gal-various-angles/, Mar. 27, 2015.
(Continued)

*Primary Examiner* — Jeanette E Chapman
(74) *Attorney, Agent, or Firm* — Peacock Law P.C.; Philip D. Askenazy (57) ABSTRACT

Roof brackets for attaching a structure such as a patio cover to a building, and methods for installing the brackets. The brackets have a saddle for receiving a support beam of the structure. The brackets can be attached to the building roof, but do not penetrate the roof substrate, thus preventing leakage and other structural problems. The roof brackets comprise a plate that is installed between the roof substrate and the shingles or tile on the roof. The brackets are available in different configurations depending on the roof pitch for easy installation. One roof bracket has a riser so that the saddle is lifted above the roof. Another roof bracket is configured so that when installed the saddle is located beyond the edge of the roof. Other brackets can be attached to the rafters under the roof. These also come in different configurations depending on roof pitch, and they are configured to extend below and outward from the fascia.

5 Claims, 14 Drawing Sheets

Related U.S. Application Data (60) Provisional application No. 62/180,226, filed on Jun. 16, 2015.

(51) Int. Cl.
   *E04B 1/26* (2006.01)
   *E04D 13/00* (2006.01)
   *E04D 13/12* (2006.01)
   *F24S 25/61* (2018.01)
   *F24S 25/613* (2018.01)
   *E04B 1/38* (2006.01)

(52) U.S. Cl.
   CPC ........... *F16M 13/02* (2013.01); *F24S 25/613* (2018.05); *E04B 2001/2644* (2013.01); *E04B 2001/405* (2013.01); *Y02B 10/12* (2013.01); *Y02B 10/20* (2013.01); *Y02E 10/47* (2013.01)

(56) References Cited

U.S. PATENT DOCUMENTS

| | | | |
|---|---|---|---|
| 4,229,919 A | 10/1980 | Hughes | |
| 4,333,289 A | 6/1982 | Strickland | |
| 4,340,100 A * | 7/1982 | Anderson, II | E04G 21/1891 269/315 |
| 4,387,543 A | 6/1983 | Tschan et al. | |
| 4,560,301 A * | 12/1985 | Gilb | B21D 53/38 403/232.1 |
| 5,004,369 A * | 4/1991 | Young | E04B 1/2612 403/232.1 |
| 5,056,750 A | 10/1991 | Ellithorpe | |
| 5,190,268 A * | 3/1993 | Espinueva | E04H 17/1421 256/65.01 |
| 5,228,667 A * | 7/1993 | Bridegum | E04G 21/16 269/45 |
| 5,230,198 A * | 7/1993 | Callies | E04B 1/2608 403/232.1 |
| 5,375,384 A | 12/1994 | Wolfson | |
| 5,380,116 A * | 1/1995 | Colonias | E04B 1/2608 403/170 |
| 5,456,441 A | 10/1995 | Callies | |
| D368,647 S * | 4/1996 | Koebbe | D25/66 |
| 5,561,950 A | 10/1996 | Collins et al. | |
| 5,603,187 A | 2/1997 | Merrin et al. | |
| 5,797,694 A * | 8/1998 | Breivik | E04B 1/2608 403/231 |
| 6,070,368 A | 6/2000 | Anderson | |
| 6,820,868 B1 * | 11/2004 | Reymus | E04D 13/158 269/152 |
| 7,285,006 B1 * | 10/2007 | Daily | H01R 4/4809 439/441 |
| 7,575,213 B2 | 8/2009 | Rausch | |
| D607,711 S | 1/2010 | Adams et al. | |
| 8,938,932 B1 | 1/2015 | Wentworth et al. | |
| 9,347,231 B2 * | 5/2016 | Cormier | E04G 17/18 |
| 9,705,447 B2 * | 7/2017 | Cavieres | H02S 30/10 |
| 9,809,974 B1 * | 11/2017 | Brekke | E04B 1/40 |
| 2005/0122016 A1 | 6/2005 | Behroozi | |
| 2007/0017741 A1 * | 1/2007 | Martinez | E04G 5/041 182/69.6 |
| 2007/0090232 A1 * | 4/2007 | Cantis | E04G 3/26 248/121 |
| 2007/0145222 A1 | 6/2007 | Rausch | |
| 2008/0121273 A1 | 5/2008 | Plaisted et al. | |
| 2009/0090082 A1 | 4/2009 | Kawai et al. | |
| 2012/0272608 A1 | 11/2012 | Groenesteyn | |
| 2013/0212955 A1 | 8/2013 | Lethin | |
| 2014/0109492 A1 | 4/2014 | Lethin | |
| 2014/0182218 A1 | 7/2014 | O'Donnell | |
| 2014/0318073 A1 | 10/2014 | Sidhu | |
| 2016/0040430 A1 | 2/2016 | Lethin | |
| 2017/0306612 A1 * | 10/2017 | Kasprzak | E04B 1/40 |

OTHER PUBLICATIONS

"Roof Extenda Pergola Bracket", https://buybuildingsupplies.com.au/roof-extenda-pergola-bracket-box-p-27436.html, Mar. 1, 2016.
"Skylift Roof Riser", http://www.premiumbraziliandecking.com/skylift-roof-riser.html, Jan. 26, 2015.

* cited by examiner

FIG. 1

PRIOR ART

BRACKETS FOR INSTALLING BUILDING ATTACHMENTS

CROSS-REFERENCE TO RELATED APPLICATIONS

This application is a divisional of patent application Ser. No. 15/184,783, filed on Jun. 16, 2016 and issuing as U.S. Pat. No. 9,822,524 on Nov. 21, 2017, entitled "Brackets for Installing Building Attachments", which application claims priority to and the benefit of filing of U.S. Provisional Patent Application Ser. No. 62/180,226, entitled "Brackets for Installing Building Attachments", filed on Jun. 16, 2015. The specification and claims thereof are incorporated herein by reference.

BACKGROUND OF THE INVENTION

Field of the Invention (Technical Field)

The present invention relates to brackets for attaching patio covers or other structures or attachments to a house or other building.

Background Art

Note that the following discussion may refer to a number of publications and references. Discussion of such publications herein is given for more complete background of the scientific principles and is not to be construed as an admission that such publications are prior art for patentability determination purposes.

Figure 1:
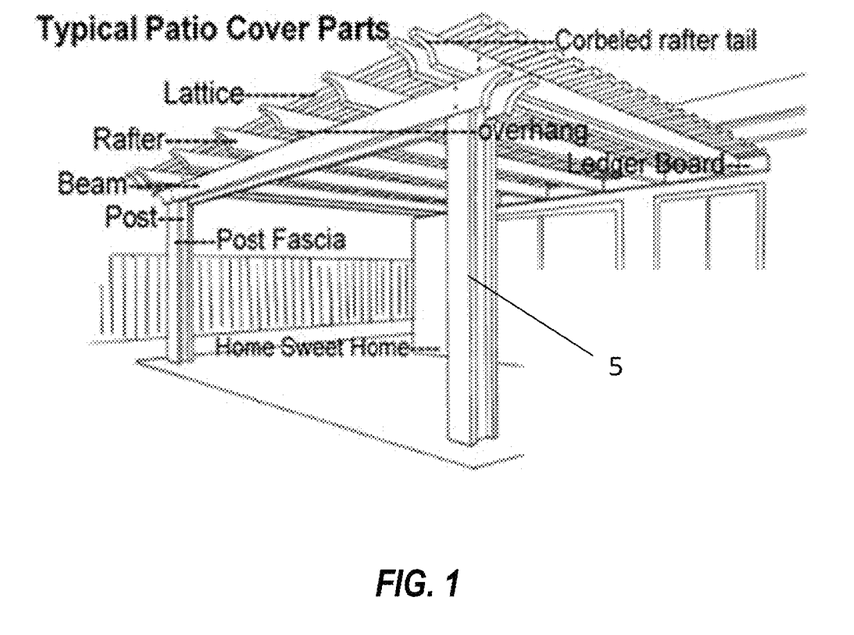
FIG. 1 shows a typical patio cover attached to a house.
Figure 2:
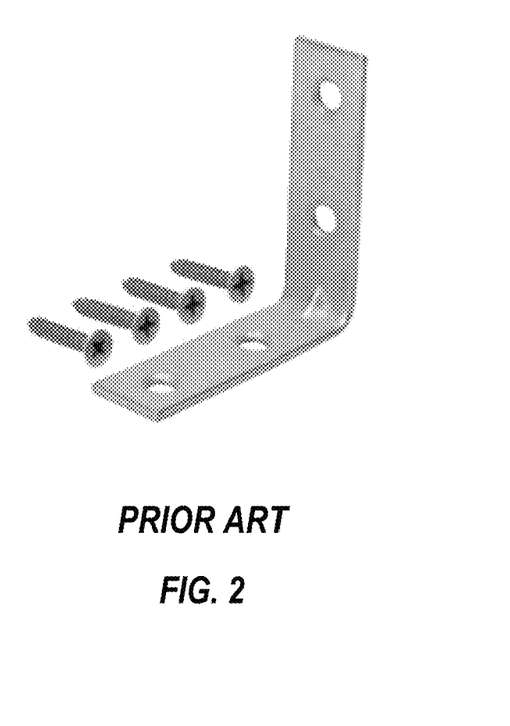
FIG. 2 shows a standard "L" bracket.

A patio cover, such as the one shown in FIG. 1, is typically attached to the roof or wall of a house or other building. The most common method of attaching the support beam to the house is via standard "L" brackets, shown in FIG. 2, which have many disadvantages. They must be bent to match the roof pitch on site, they are weak, unsightly and are needed at 24" on center connections. They also are typically attached to the building's wall or fascia, which affects appearance and requires the removal of existing rain gutters.

SUMMARY OF THE INVENTION (DISCLOSURE OF THE INVENTION

The present invention is a bracket for attaching a structure to a roof of a building, the bracket comprising a plate sufficiently flat for the plate to be disposed between a roof substrate and a roof covering; and a saddle for receiving a support beam to support the structure; wherein the angle between the plate and the saddle is configured for a particular roof pitch, so that when the flat plate is attached to the roof an opening of the saddle is substantially vertically oriented; and wherein the bracket does not comprise a component for penetrating the roof substrate. The structure preferably comprises a patio cover, an architectural feature, a solar panel, a roof deck, a trellis, an arbor, or a walkway. The roof covering optionally comprises shingles or tiles. The bracket optionally further comprises a vertical riser separating the plate and the saddle, the riser configured to extend upward through the roof covering. Alternatively the saddle can be located at an end of the plate so that when the plate is attached to the roof the saddle is disposed beyond an edge of the roof, and the saddle is preferably disposed above a roof gutter. In this embodiment the bottom of the saddle is preferably attached to an end portion of the plate that is bent at the roof pitch angle with respect to the remaining portion of the plate. The bracket is preferably sufficiently load bearing so that only one bracket is needed along every eight feet of the support beam.

The present invention is also a bracket for attaching a structure to a building, the bracket comprising a first portion configured to attach the bracket to the side of a rafter so that when the first portion is attached to the rafter a top edge of the first portion is disposed against the underside of the roof substrate; a second vertical portion comprising an angle with respect to the first portion, the angle configured for a particular roof pitch, the second vertical portion sufficiently high to extend below a bottom edge of a fascia when the first portion is attached to the rafter; a third horizontal portion sufficiently long to extend beyond a width of the fascia; and a saddle for receiving a support beam to support the structure. The structure preferably comprises a patio cover, an architectural feature, a solar panel, a roof deck, a trellis, an arbor, or a walkway. When the first portion is attached to the rafter the forward edge of the second vertical portion is preferably disposed against the rear face of the fascia. The bracket is preferably sufficiently load bearing so that only one bracket is needed along every eight feet of the support beam.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate the practice of embodiments of the present invention and, together with the description, serve to explain the principles of the invention. The drawings are only for the purpose of illustrating certain embodiments of the invention and are not to be construed as limiting the invention. In the drawings.

DETAILED DESCRIPTION OF EMBODIMENTS OF THE INVENTION

Embodiments of the present invention are brackets to install a lattice or solid patio cover by attaching it to an existing building without requiring attachment to the building wall or fascia. The brackets are preferably either roof mounted brackets or rafter (under-mount) brackets. Unlike typical roof brackets, the brackets of the present invention do not have to be mounted through the roof; they can be mounted under shingles or tiles without penetrating the roof itself. The brackets preferably comprise powder coated steel and are preferably available in all standard roof pitches. By ensuring consistent pitch angles, a patio cover is true and level and conforms to building codes for rainwater drainage. The powder coating preferably matches the color of the patio cover and/or rafter. The brackets are preferably structurally strong enough so that only one bracket per support post 5 as shown in FIG. 1 is required, per engineering standards. Support posts 5 are typically spaced at least eight feet apart. For existing brackets, one typically needs to be installed every 24" on the building, but brackets of the present invention are preferably sufficiently load bearing so that one needs to be mounted only every eight feet (or more). The present invention thus requires far fewer brackets to support a given load, and because the brackets are much easier to install, installation time is greatly reduced. The present brackets are preferably sufficiently strong to support weight bearing loads heavier than those of patio covers, for example loads due to structures such as wood or metal architectural features, solar panels, roof decks, trellis, arbors, walkways, and the like. It is not necessary to remove existing rain gutters to install the present brackets. The present brackets provide added height under the patio cover, providing adequate slope for drainage while preserving views and enabling the use of hanging accessories such as ceiling fans. Brackets of the present invention are typically less obtrusive than typical "L" brackets, and are more resistant to seismic events.

Roof brackets of the present invention preferably comprise two steel components, a base plate and a saddle (or beam seat), that are preferably welded together, although any material may be used. The base plate for the roof mount bracket is preferably formed from ¼"×3" flatbar and comprises an optional riser and a roof mounted plate. The base plate for the rafter or under-mount bracket is preferably water jet cut from ¼" steel plate to the desired pitch, including the mounting holes. The saddle is preferably manufactured by forming a piece of 3/16"×3" steel flat bar into "U" shape that will accommodate a typical patio cover support beam. The two pieces are then preferably welded with a typical ¼" fillet weld. The bracket is then preferably sandblasted, primed with a zinc based primer, and then powder coated to the desired color. Alternatively the entire bracket may comprise a single molded or cast piece.

Figure 3:
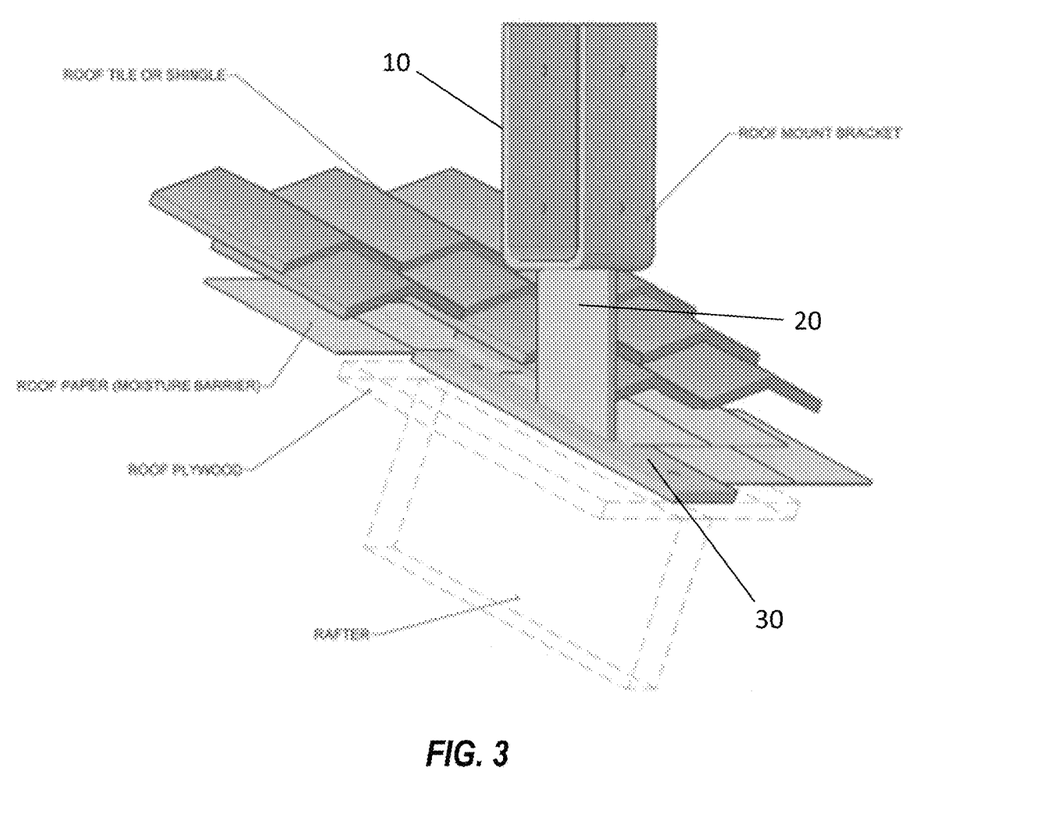
FIG. 3 is a drawing of a high roof mount bracket of the present invention.
Figure 4:
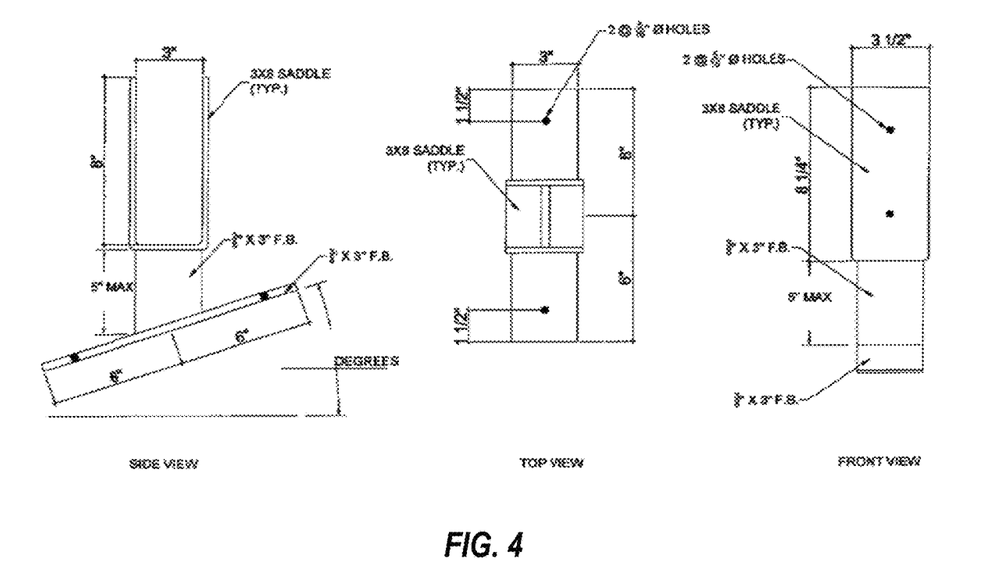
FIG. 4 shows engineering drawings of the high roof mounted bracket of FIG. 3.
Figure 5:
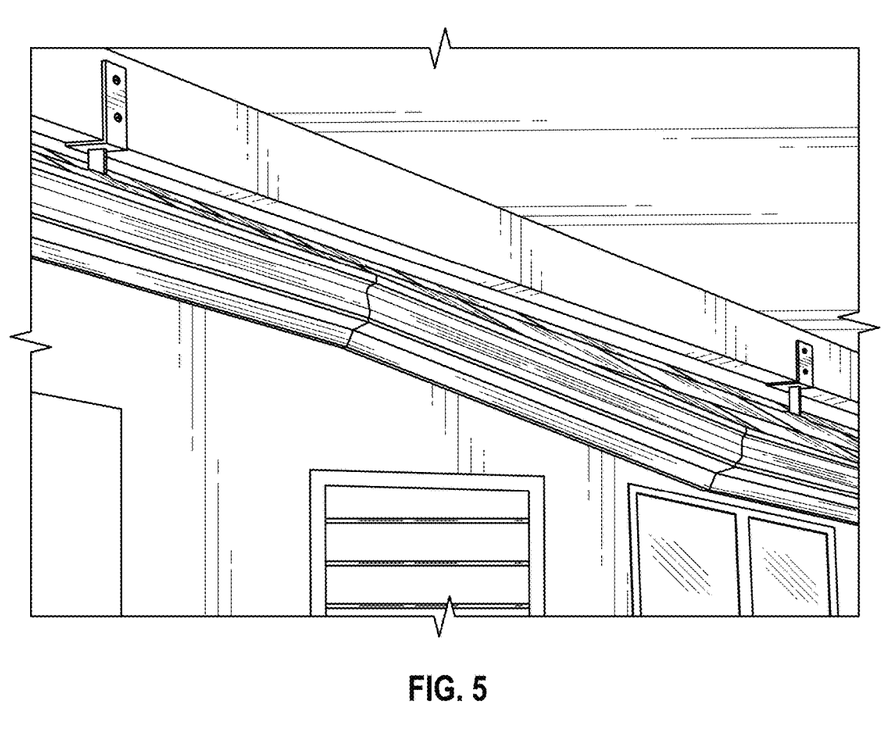
FIG. 5 shows high roof mounted brackets as installed
Figure 6:
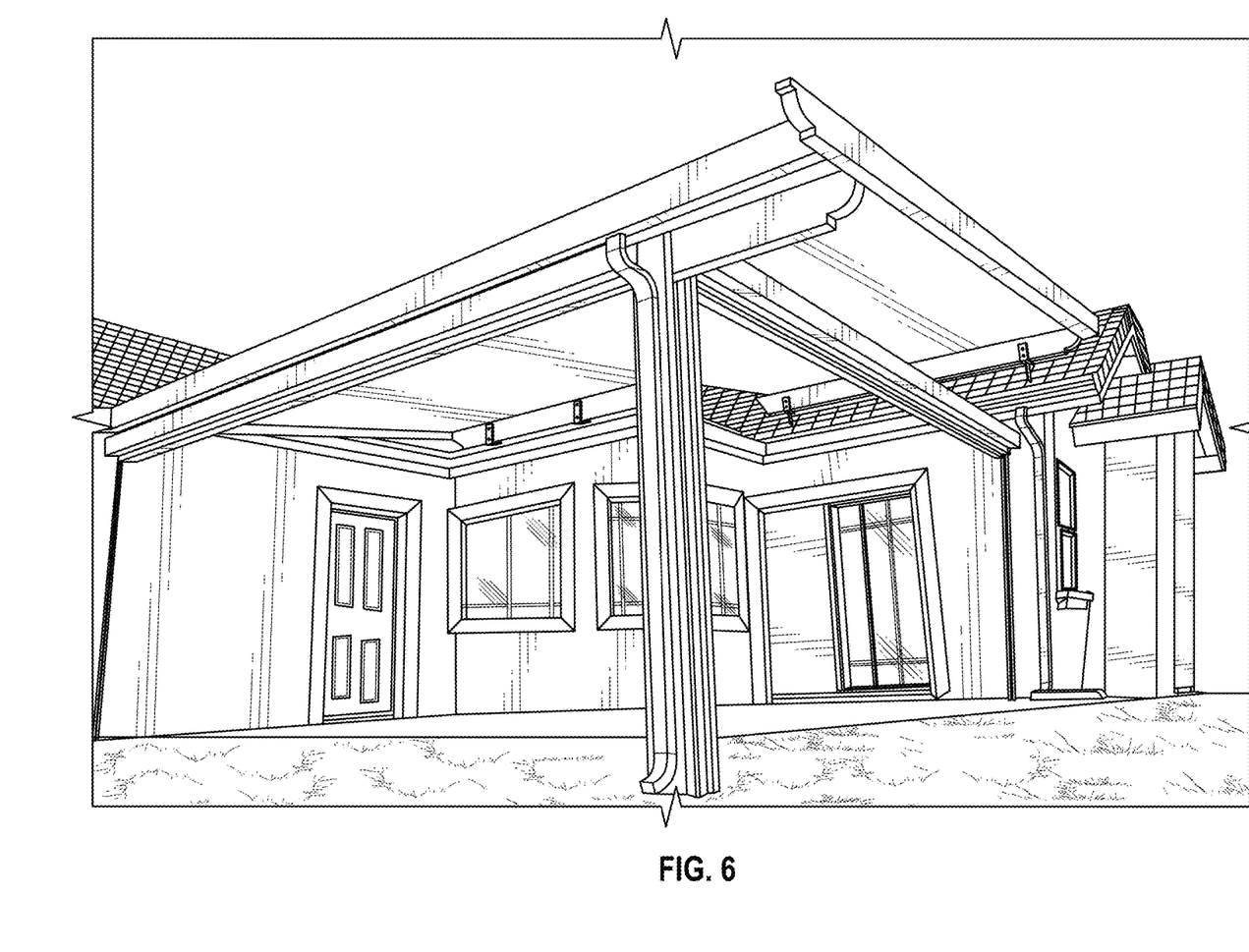
FIG. 6 is a photograph of a finished patio cover installed using high roof mounted brackets of the present invention.

FIG. 3 shows a high roof mount bracket of the present invention comprising beam seat or saddle 10, riser 20, and roof mounted plate 30. The roof mounted bracket can be produced in different models having different angles between riser 20 and roof mounted plate 30 corresponding to different standard roof pitches. FIG. 4 shows engineering drawings of an example of the high roof mounted bracket. As shown in FIGS. 3 and 5, the roof mounted bracket is installed under the roof material and is attached, preferably by screwing, to the roof substrate. In the case of the roofing material comprising shingles, the shingles can be lifted up to install the bracket; in the case of tiles, the tiles can be removed and then replaced after the brackets are installed. The bracket installation does not require any penetration through the roof substrate, thus minimizing the risk of roof leakage and/or damage. FIG. 6 is a photograph of a finished patio cover installed using roof mounted brackets of the present invention.

Figure 7:
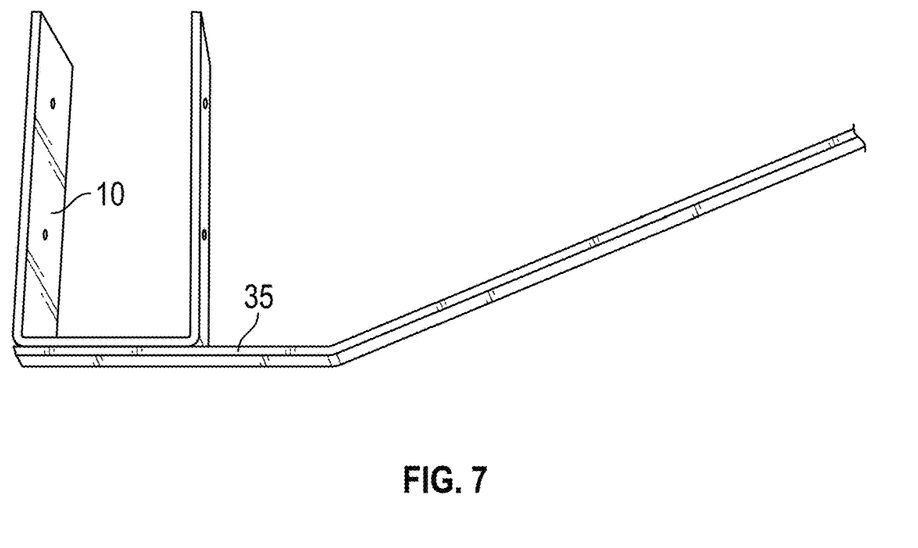
FIG. 7 shows a picture of a low roof mount bracket of the present invention.
Figure 8:
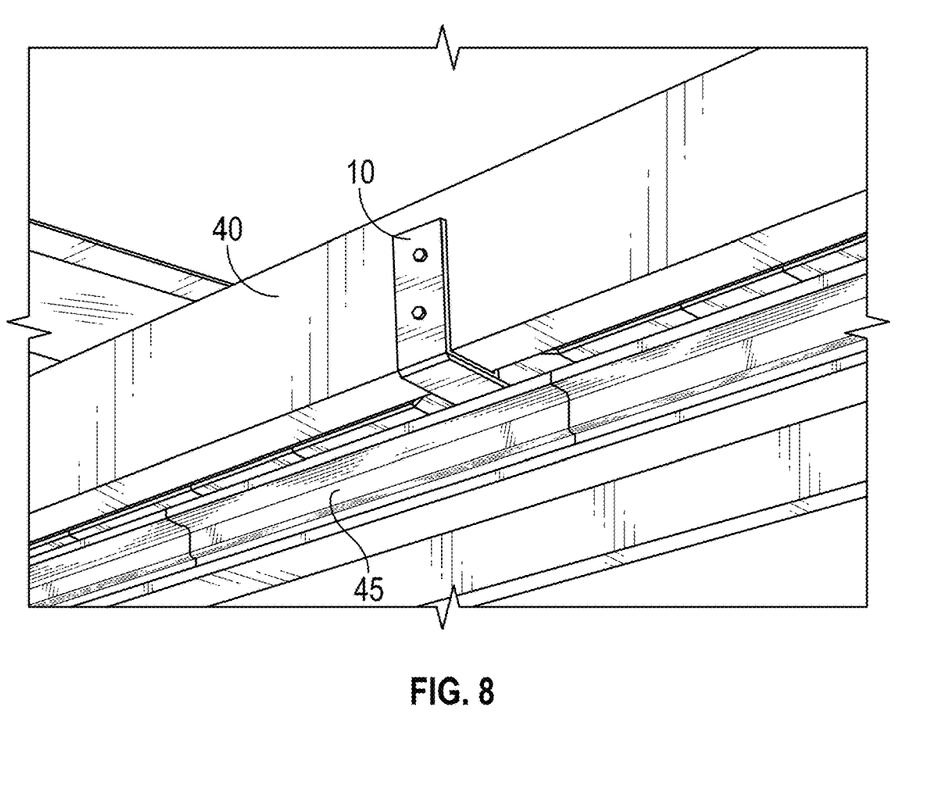
FIG. 8 shows a close up view of the low roof mount bracket as installed.
Figure 9:
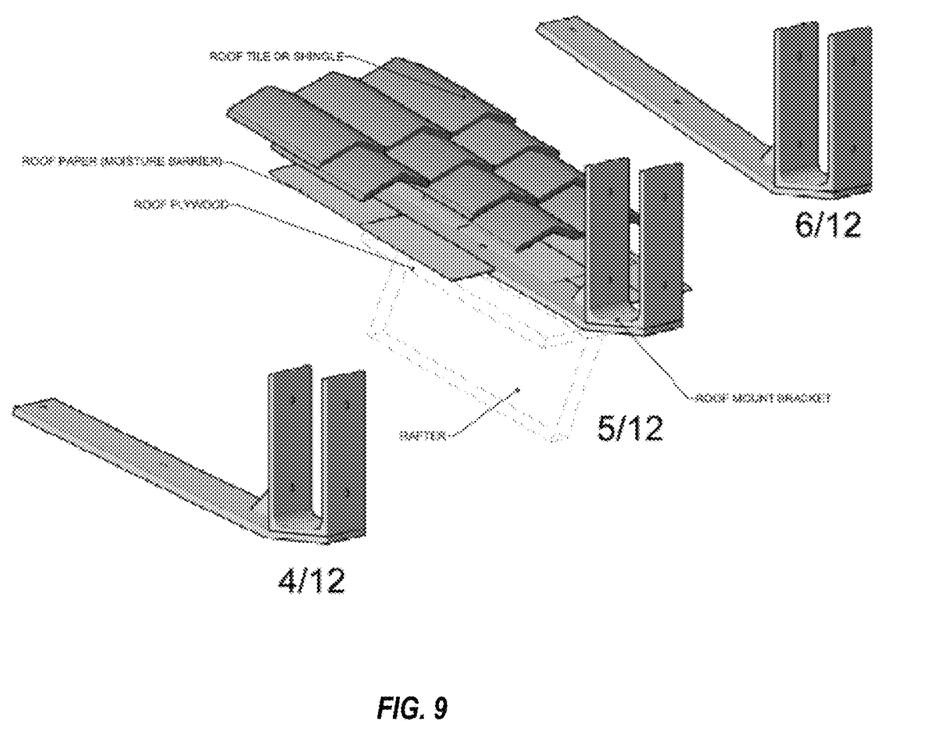
FIG. 9 shows two drawings of the low roof mount bracket with different pitches and one showing the plate installed under roof tiles or shingles.
Figure 10:
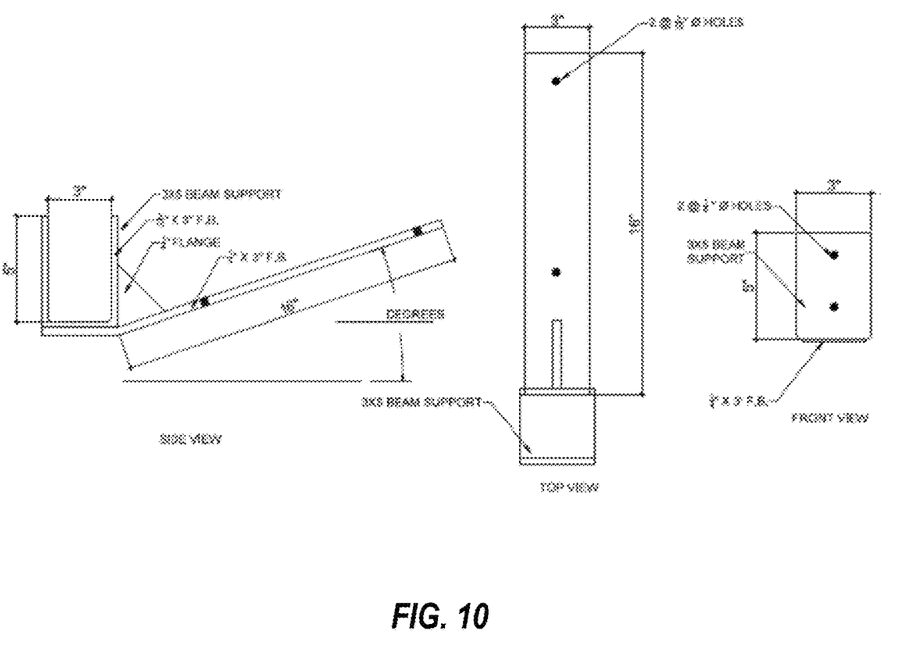
FIG. 10 shows engineering drawings of the low roof mount bracket of FIGS. 7-9.

FIG. 7 shows a picture of a low roof mount bracket, an alternative embodiment of a roof mount bracket of the present invention, comprising saddle 10 and roof mounted plate 35. This embodiment does not have a riser and is particularly useful for applications where the patio cover beam must be horizontally offset from the edge of the roof. FIG. 8 shows a close up view of saddle 10 holding patio cover beam 40, and shows that installation can be performed without removal of rain gutter 45. FIG. 9 shows drawings of the low roof mount bracket embodiment having different pitches and showing the plate installed under roof tiles or shingles. FIG. 10 shows engineering drawings of an example of a low roof mount bracket.

Figure 11:
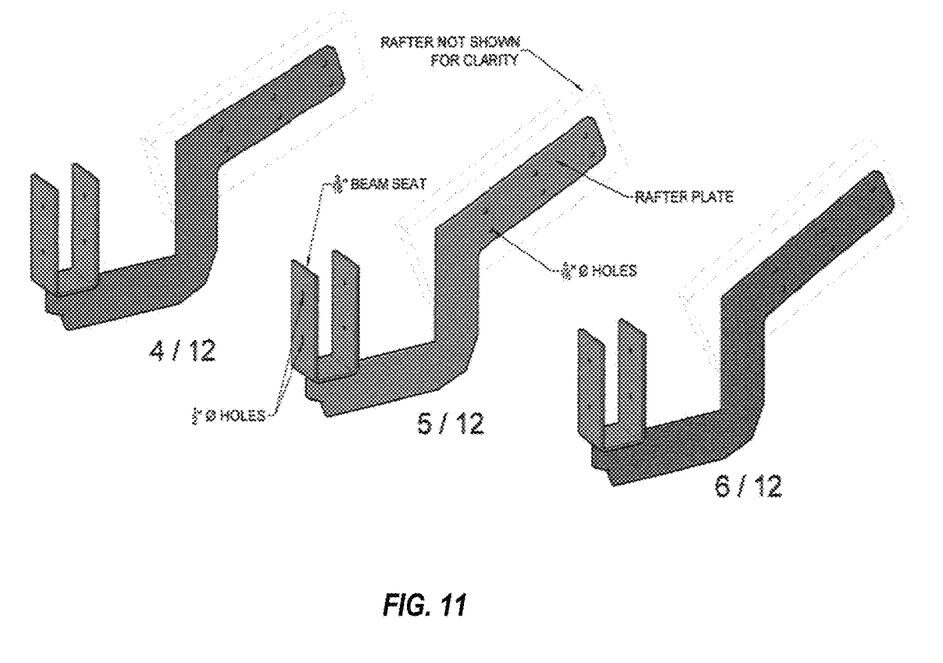
FIG. 11 shows three views of a rafter bracket of the present invention, each corresponding to a different roof pitch.
Figure 12:
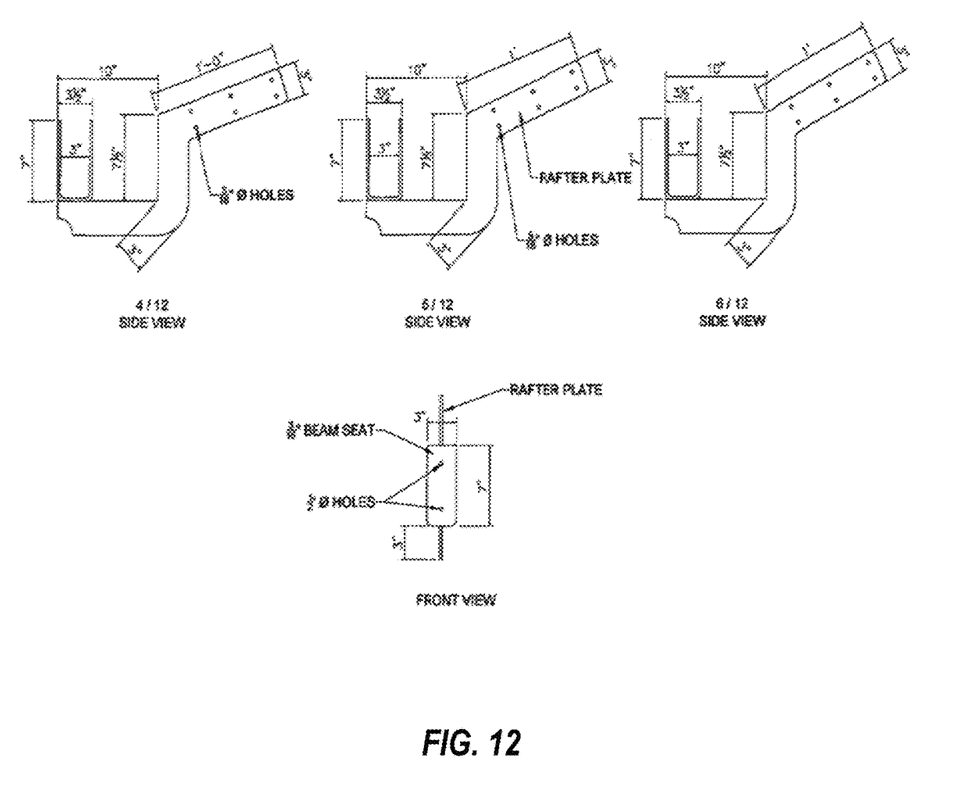
FIG. 12 shows engineering drawings of the rafter bracket of FIG. 11.
Figure 13:
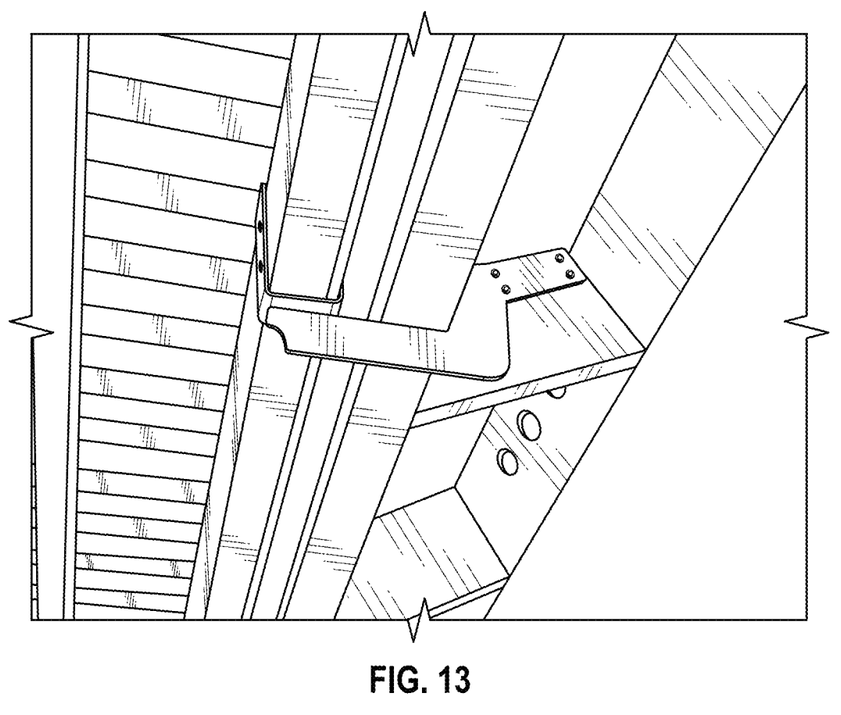
FIG. 13 shows the rafter bracket as installed.
Figure 14:
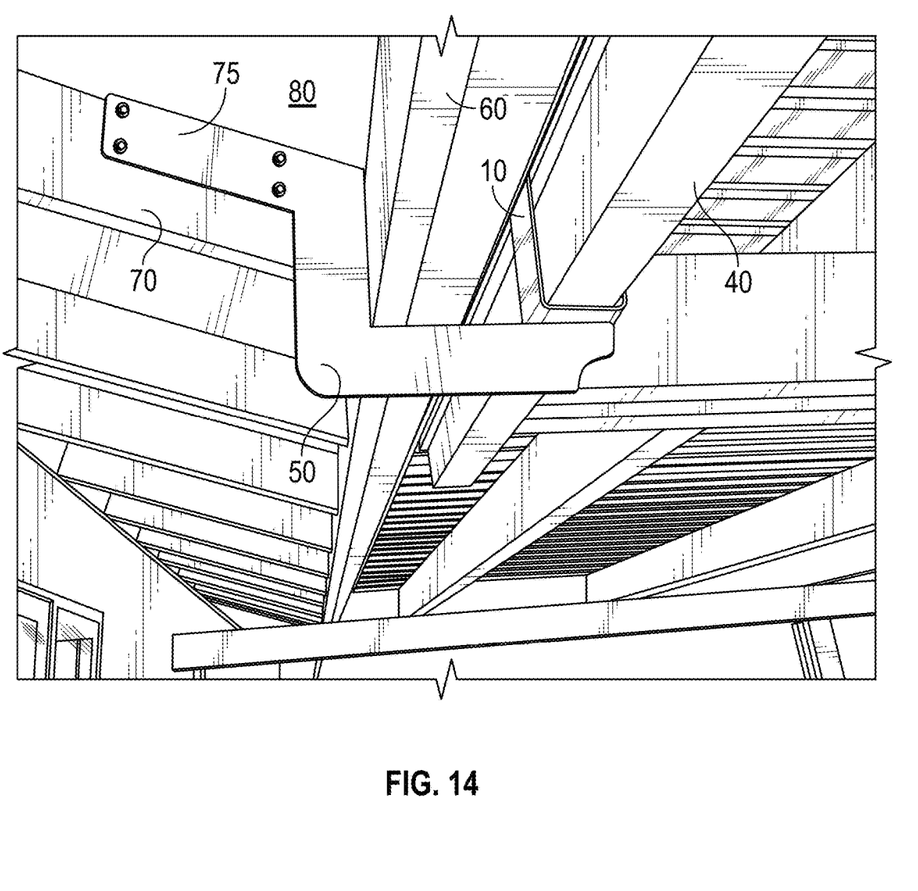
FIG. 14 is another view of the rafter bracket as installed.
Figure 15:
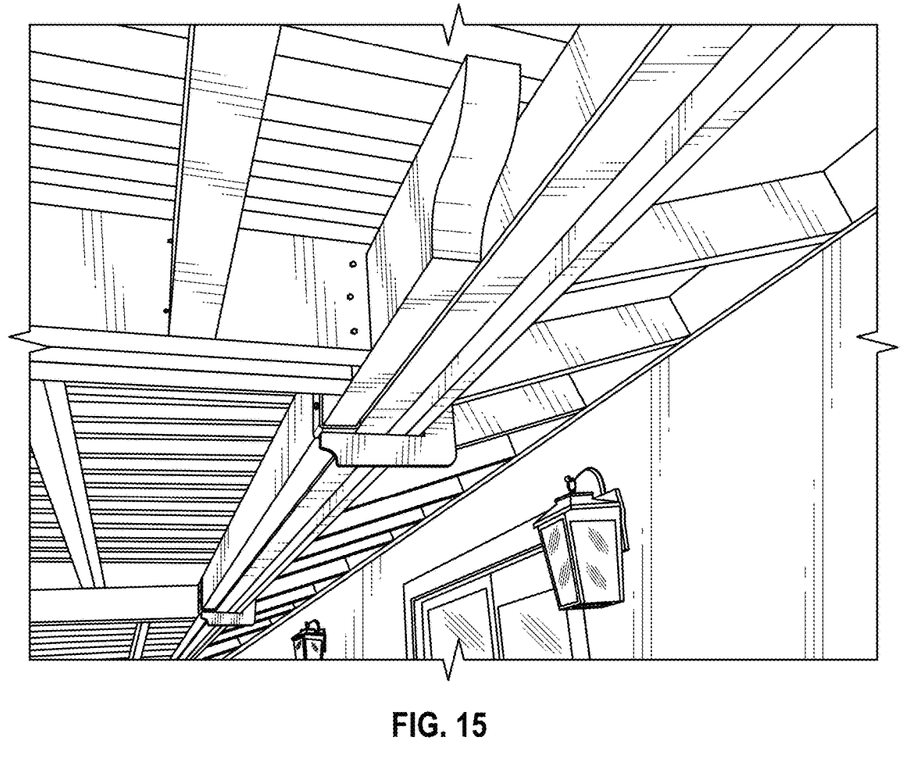
FIG. 15 is another view of the rafter bracket as installed.
Figure 16:
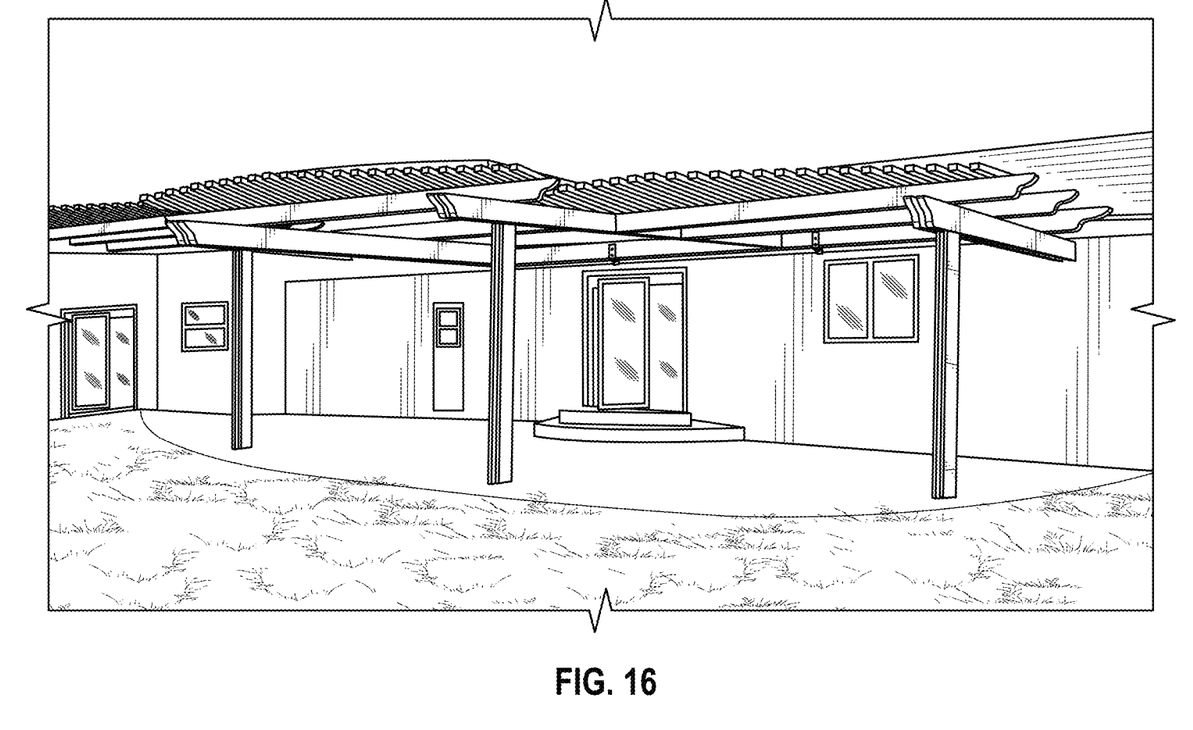
FIG. 16 is a photograph of a finished patio cover installed using rafter brackets of the present invention.

FIG. 11 shows three views of rafter brackets of the present invention, each corresponding to a different roof pitch. FIG. 12 shows corresponding engineering drawings of the rafter brackets. As shown in FIGS. 13-15, base plate 50 preferably extends from saddle 10 under fascia 60 of the building and angles upward to enable rafter plate portion 75 for attach to rafter 70. Because base plate 50 is preferably available in all roof pitches, the top of rafter plate portion 75 preferably rests directly against underside 80 of the roof, enabling easy and fast installation so that saddle 10 is substantially automatically vertically oriented as installed, without requiring leveling. This installation eliminates any risk of roof leakage or damage. This bracket can be installed through a slot cut in a soffit if one is present. FIG. 16 is a photograph of a finished patio cover installed using rafter brackets of the present invention.

The user can choose to use roof mounted brackets or rafter brackets, depending on the desired mounting height and roof construction. The desired bracket is attached the roof substrate or roof rafter (respectively) preferably using 4-Simpson SDS style screws. Next the user simply installs the 3"×8" patio cover support beam into the saddle (beam seat), affixes it with screws and is ready to finish typical patio cover installation.

Although the invention has been described in detail with particular reference to the disclosed embodiments, other embodiments can achieve the same results. Variations and modifications of the present invention will be obvious to those skilled in the art and it is intended to cover all such modifications and equivalents. The entire disclosures of all patents and publications cited above are hereby incorporated by reference.

What is claimed is:

1. A bracket for attaching a structure to a building, the bracket comprising:
a first portion configured to attach the bracket to a side of a rafter;
a second portion comprising an angle with respect to said first portion, said angle configured for a particular roof pitch, said second portion sufficiently high to extend vertically below a bottom edge of a fascia when said first portion is attached to the rafter;
a third portion sufficiently long to extend horizontally beyond a width of the fascia; and a saddle attached at an angle to said third portion for receiving a support beam to support the structure, so that when said first portion is attached to the rafter an opening of the saddle is substantially vertically oriented.

2. The bracket of claim 1 wherein the structure comprises a patio cover, an architectural feature, a solar panel, a roof deck, a trellis, an arbor, or a walkway.

3. The bracket of claim 1 wherein when said first portion is attached to the rafter a forward edge of said second vertical portion is disposed against a rear face of the fascia.

4. The bracket of claim 1 sufficiently load bearing so that only one bracket is needed along every eight feet of the support beam.

5. The bracket of claim 1 wherein when said first portion is attached to the rafter a top edge of said first portion is disposed against an underside of a roof substrate.

* * * * *